US007142027B2

(12) United States Patent
Lee et al.

(10) Patent No.: US 7,142,027 B2

(45) Date of Patent: Nov. 28, 2006

(54) DELAY LOCKED LOOP (DLL) USING AN OSCILLATOR AND A COUNTER AND A CLOCK SYNCHRONIZING METHOD

(75) Inventors: Jang-Sub Lee, Osan-si (KR); Yong-Weon Jeon, Suwon-si (KR)

(73) Assignee: Samsung Electronics,Co., Ltd. (KR)

( * ) Notice: Subject to any disclaimer, the term of this patent is extended or adjusted under 35 U.S.C. 154(b) by 12 days.

(21) Appl. No.: 11/037,484

(22) Filed: Jan. 18, 2005

(65) Prior Publication Data

US 2005/0162204 A1 Jul. 28, 2005

(30) Foreign Application Priority Data

Jan. 28, 2004 (KR) ..................... 10-2004-0005318

(51) Int. Cl.
*H03L 7/06* (2006.01)

(52) U.S. Cl. ...................... 327/158; 327/149; 327/161

(58) Field of Classification Search ........ 327/156–159, 327/147–150, 153, 161
See application file for complete search history.

(56) References Cited

U.S. PATENT DOCUMENTS 5,999,027 A * 12/1999 Yamazaki ................... 327/161
6,429,693 B1 8/2002 Staszewski et al. ........... 327/12
6,593,773 B1 7/2003 Staszewski et al. ........... 326/46
6,731,667 B1 * 5/2004 Lee et al. ................... 375/130
6,754,613 B1 * 6/2004 Tabatabaei et al. ......... 702/189
6,993,109 B1 * 1/2006 Lee et al. ................... 375/376

FOREIGN PATENT DOCUMENTS

JP 2002-101083 4/2002
KR 2000-0075411 12/2000

* cited by examiner

*Primary Examiner*—Dinh T. Le
(74) *Attorney, Agent, or Firm*—F. Chau & Associates, LLC

(57) ABSTRACT

Provided are a delay locked loop (DLL) using an oscillator and a counter and a clock synchronizing method. The DLL converts cycle information of an input clock signal into digital information using the oscillator and the counter and generates output clock signals from the input clock signal using the digital information after a predetermined delay time elapses. The output clock signals each have a duty cycle of 50%. The DLL includes: a time-to-digital converter for converting one period (T) of the input clock signal into a digital signal to generate coarse cycle information signals and fine cycle information signals; a first cycle delay unit for generating a first cycle clock signal delayed by T/2 from an internal clock signal and half cycle information signals in response to the coarse cycle information signals and the fine cycle information signals; a second cycle delay unit for generating a second cycle clock signal delayed by T/4 from the input clock signal in response to the coarse cycle information signals and half cycle information signals; and a clock recovery unit for generating the output clock signals in response to the first and second cycle clock signals.

24 Claims, 6 Drawing Sheets

DELAY LOCKED LOOP (DLL) USING AN OSCILLATOR AND A COUNTER AND A CLOCK SYNCHRONIZING METHOD

CROSS-REFERENCE TO RELATED APPLICATION

This application claims priority to Korean Patent Application No. 2004-5318, filed on Jan. 28, 2004, in the Korean Intellectual Property Office, the disclosure of which is incorporated herein in its entirety by reference.

FIELD OF THE INVENTION

The present invention relates to a semiconductor integrated circuit, and more particularly, to a delay locked loop (DLL) using an oscillator and a counter and a clock synchronizing method.

DESCRIPTION OF THE RELATED ART

FIG. 1 is a block diagram of a conventional delay locked loop (DLL) 100. Referring to FIG. 1, the DLL 100 receives an input clock signal CLK_IN and generates an output clock signal CLK_OUT that is phase-locked to the input clock signal CLK_IN. The DLL 100 includes a phase detector 110, a delay controller 120, a delay line 130, and a delay replica 140. The output clock signal CLK_OUT is used as a clock signal for operating internal components of a system. The delay replica 140 compensates for a delay of a predetermined path via which the output clock signal CLK_OUT is transmitted.

The phase detector 110 compares phases of the input clock signal CLK_IN and the output clock signal CLK_OUT to generate an up/down control signal UP/DN. The up/down control signal UP/DN is transmitted to the delay controller 120. The output of the delay controller 120 sets the number of unit delay cells 131, 132, 133 and 134 of the delay line 130 to be activated. The delay line 130 has an inverter chain structure such that two inverters construct a single unit delay cell. The delay controller 120 comprises a shifter register or a counter that operates in response to the up/down control signal UP/DN.

Though the DLL 100 is easily designed because of its simple digital configuration, the delay line 130 having the inverter chain structure occupies a large area in the DLL 100 and consumes a large amount of power. Furthermore, the DLL 100 requires a separate duty cycle corrector to correct a duty cycle of the output clock signal CLK_OUT. However, it is difficult to construct such a duty cycle corrector in a digital or analog circuit. Therefore, a DLL that has a duty cycle corrector, requires a smaller area and that consumes less power than the conventional DLL 100 is desired.

SUMMARY OF THE INVENTION

The present invention provides a delay locked loop (DLL) using an oscillator and a counter and a clock synchronizing method using the DLL.

The DLL according to the present invention converts cycle information of an input clock signal into digital information using an oscillator and a counter and generates output clock signals based on the input clock signal using the digital information after a predetermined delay time elapses. The output clock signals each have a duty cycle of 50%. The DLL does not require a large area or consume a large amount of power as compared to a conventional DLL having an inverter chain structure. In addition, the DLL stably generates the output clock signals after the lapse of various periods of delay, and does not require a separate duty cycle corrector for correcting the duty cycle of the output clock signals.

According to an aspect of the present invention, there is provided a DLL comprising a time-to-digital converter for receiving an input clock signal and converting a period (T) of the input clock signal into a digital signal to generate coarse cycle information signals and fine cycle information signals; a first cycle delay unit for generating a first cycle clock signal delayed by T/2 from an internal clock signal and half cycle information signals in response to the coarse cycle information signals and fine cycle information signals; a second cycle delay unit for generating a second cycle clock signal delayed by T/4 from the input clock signal in response to the coarse cycle information signals and half cycle information signals; and a clock recovery unit for generating the internal clock signal and output clock signals in response to the first and second cycle clock signals.

According to another aspect of the present invention, there is provided a DLL comprising a time-to-digital converter for receiving an input clock signal and converting a period (T) of the input clock signal into a digital value to generate coarse cycle information signals and fine cycle information signals; a first delay unit for receiving the coarse cycle information signals, the fine cycle information signals and an internal clock signal, to generate a first clock signal delayed by a first delay time from the internal clock signal and a first cycle information signal; a second delay unit for receiving the coarse cycle information signals, the first cycle information signal and the input clock signal, to generate a second clock signal delayed by a second delay time from the input clock signal; and a clock recovery unit for receiving the first and second clock signals, to generate output clock signals that are delayed by the first delay time from the internal clock signal and the input clock signal and have a duration corresponding to the second delay time.

According to yet another aspect of the present invention, there is provided a clock synchronizing method comprising receiving an input clock signal and converting a period (T) of the input clock signal into a digital signal to generate coarse cycle information signals and fine cycle information signals; generating a first cycle clock signal delayed by a first delay time from an internal clock signal and half cycle information signals in response to the coarse cycle information signals and the fine cycle information signals; and generating a second cycle clock signal delayed by a second delay time from the input clock signal in response to the coarse cycle information signals and the fine cycle information signals. The method further includes generating the internal clock signal delayed by the first delay time from the input clock signal in response to the coarse cycle information signals and the half cycle information signals; and generating output clock signals delayed by the second delay time from the input clock signal the output clock signals having a duration corresponding to the second cycle time in response to the first and second cycle clock signals.

BRIEF DESCRIPTION OF THE DRAWINGS

The above and other features of the present invention will become more apparent by describing in detail exemplary embodiments thereof with reference to the attached drawings in which.

DETAILED DESCRIPTION OF EXEMPLARY EMBODIMENTS OF THE INVENTION

Figure 1:
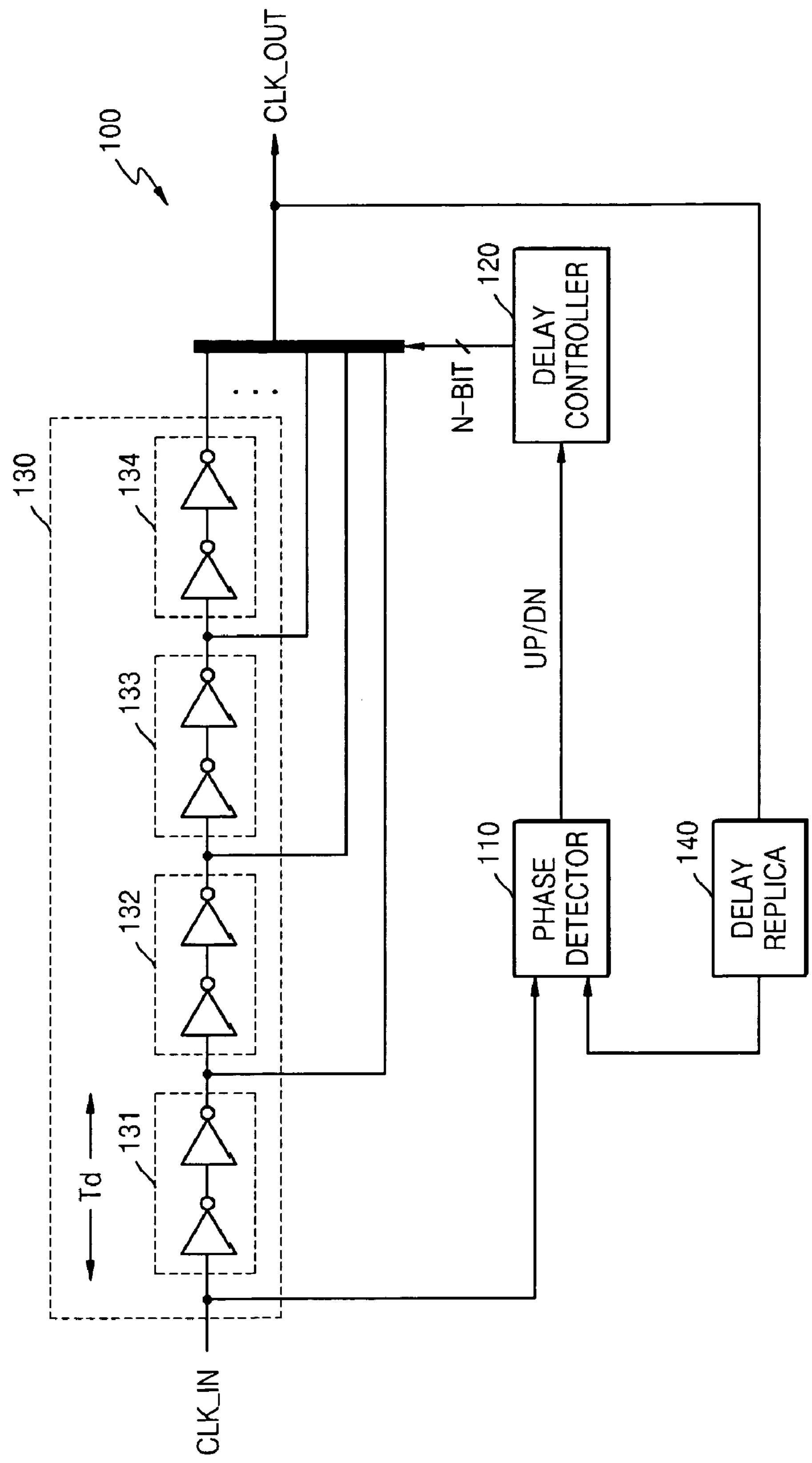
FIG. 1 is a block diagram of a conventional delay locked loop (DLL)
Figure 2:
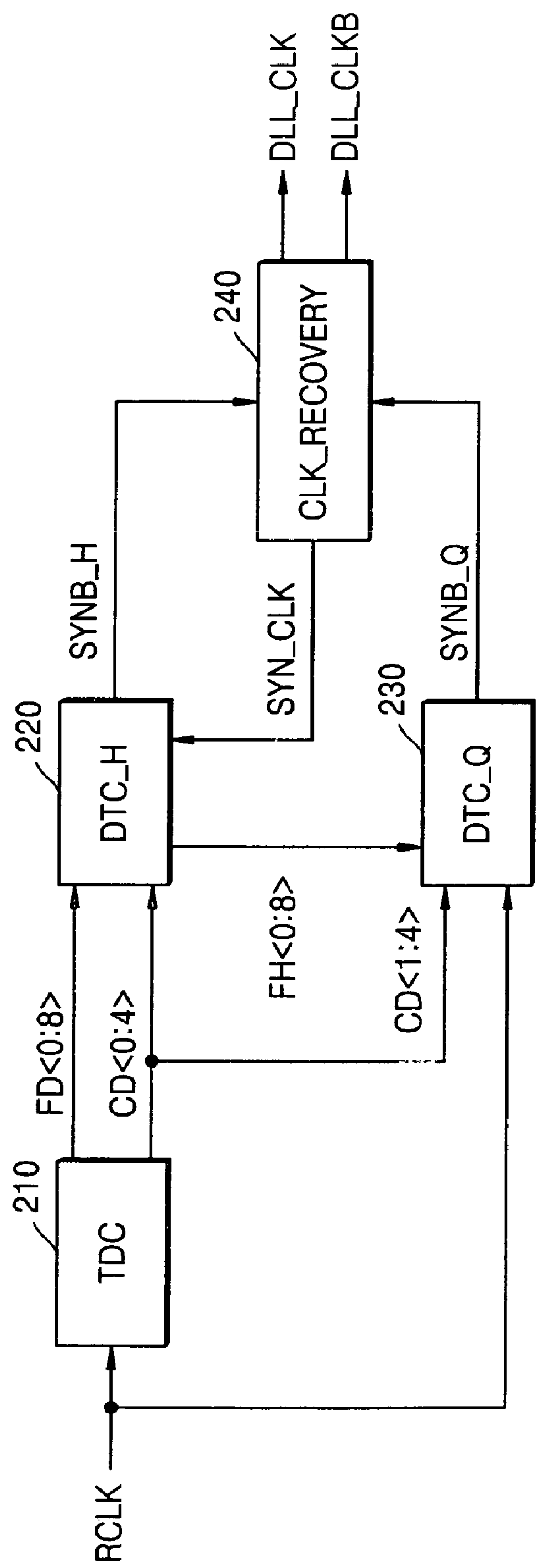
FIG. 2 is a block diagram of a DLL according to an exemplary embodiment of the present invention.

FIG. 2 is a block diagram of a delay locked loop (DLL) according to an exemplary embodiment of the present invention. Referring to FIG. 2, the DLL includes a time-to-digital converter (TDC) unit 210, a half cycle delay (DTC_H) unit 220, a quad cycle delay (DTC_Q) unit 230, and a clock recovery unit 240.

Figure 3:
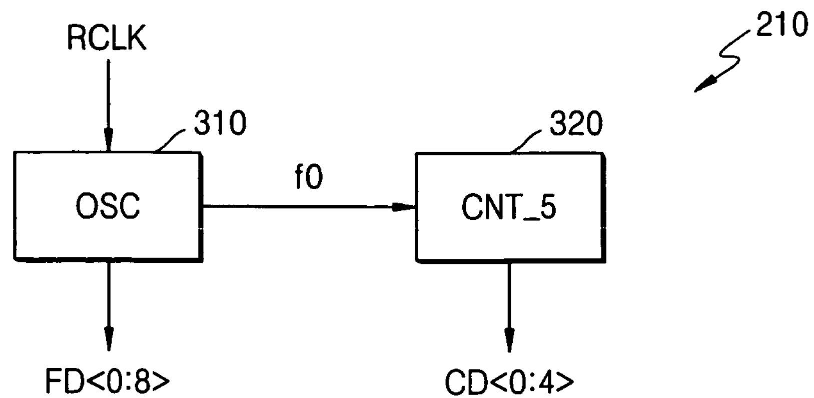
FIG. 3 illustrates a TDC unit of FIG. 2.

The TDC unit 210 is shown in detail in FIG. 3. Referring to FIG. 3, the TDC unit 210 receives an input clock signal RCLK and converts information associated with one cycle T of the input clock signal RCLK into a digital value to generate coarse cycle information signals CD<0:4> and fine cycle information signals FD<0:8>. The TDC unit 210 includes an oscillator 310 comprising unit delay cells and a counter 320 for counting the pulses of an output f0 of the last unit delay cell of the oscillator 310.

The oscillator 310 can include, for example, nine unit delay cells that are connected in serial such that outputs of the unit delay cells are output as the fine cycle information signals FD<0:8>. A single unit delay cell can also include two delay cells, which are inverters. Accordingly, the oscillator 310 includes 18 delay cells. The oscillator 310 generates the fine cycle information signals FD<0:8> when the component of one cycle of the input clock signal RCLK passes through the unit delay cells. The component of one cycle of the input clock signal RCLK is captured by a signal (not shown) for interrupting the operation of the DLL. The counter 320 counts the pulses of a first turn signal f0 that is generated in response to the output FD<8> of the last unit delay cell of the oscillator 310. The first turn signal f0 indicates that the input clock signal RCLK has passed through the unit delay cells of the oscillator 310 once. The outputs of the counter 320 are generated as the coarse cycle information signals CD<0:4>.

Figure 4:
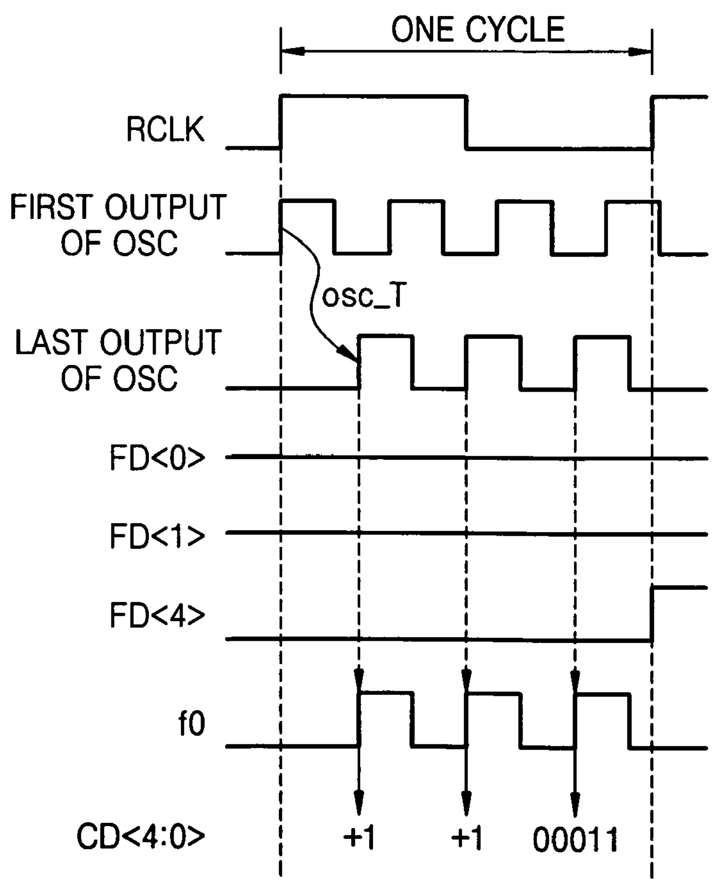
FIG. 4 is a timing diagram for explaining the operation of the TDC unit of FIG. 3.

The operation of the TDC unit 210 is illustrated in FIG. 4. Referring to FIG. 4, the output of the last unit delay cell of the oscillator 310 is delayed by a cycle OSC_T of the oscillator 310 after the output of the first unit delay cell of the oscillator 310 for one cycle of the input clock signal RCLK. The first turn signal f0 is generated in response to the output of the last unit delay cell. In the timing diagram of FIG. 4, the coarse cycle information signals CD<4:0> are generated as 00011, which means that one cycle of the input clock signal RCLK has passed through the unit delay cells of the oscillator 310 three times in response to three cycles of the first turn signal f0. During one cycle of the input clock signal RCLK, only the output of the fifth unit delay cell, that is, the fine cycle information signal FD<4> is output as a logic high signal.

Accordingly, the period of the input clock signal RCLK is calculated such that the period OSC_T of the oscillator 310 is multiplied by the value of the coarse cycle information signal CD<0:4> (in this case, 3) and the multiplied result is added to the number of delay cells (in this case, 8) that process the input clock signal for the purpose of generating the fine cycle information signal FD<4>, i.e., (3*OSC_T)+8. The actual period of the input clock signal RCLK is obtained by multiplying the resultant value by the delay time of the unit delay cells.

Referring back to FIG. 2, the DTC_H unit 220 receives the coarse cycle information signals CD<0:4>, the fine cycle information signals FD<0:8> and an internal clock signal SYN_CLK to generate a half clock signal SYNB_H delayed by T/2 from the internal clock signal SYN_CLK. The DTC_H unit 220 also generates half cycle information signals FH<0:8>. The internal clock signal SYN_CLK is generated by the clock recovery unit 240 which will be explained in more detail later.

Figure 5:
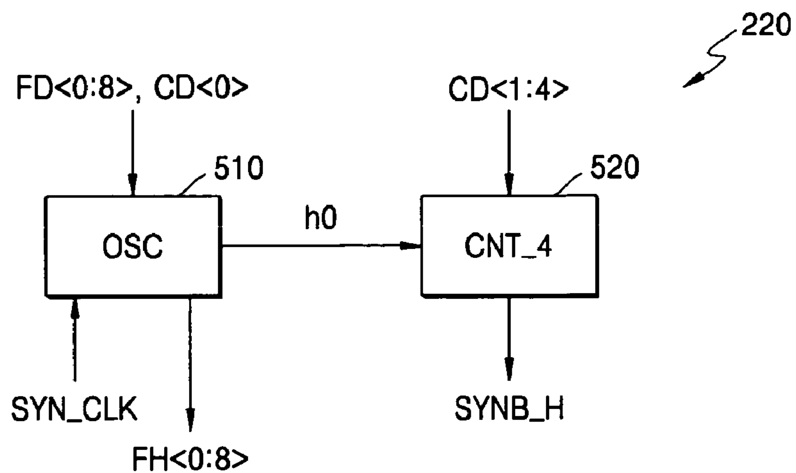
FIG. 5 illustrates a DTC_H unit of FIG. 2.

Referring to FIG. 5, the DTC_H unit 220 includes an oscillator 510 that receives the first coarse cycle information signal CD<0>, the fine cycle information signals FD<0:8> and the internal clock signal SYN_CLK to generate the half cycle information signals FH<0:8>, and a counter 520 that generates the half clock signal SYNB_H in response to a second turn signal h0 and the second through fifth coarse cycle information signals CD<1:4>. The second turn signal h0 indicates that the signals input to the oscillator 510 have passed through unit delay cells of the oscillator 510 once.

The oscillator 510 comprises nine unit delay cells that are connected in serial. Each of the unit delay cells includes two delay cells and thus the oscillator 510 includes 18 delay cells. The output of the last unit delay cell is input to the first unit delay cell. The oscillator 510 generates the second turn signal h0 in response to the output of the last unit delay cell. The DTC_H unit 220 generates the half cycle information signals FH<0:8> according to whether the value of the first coarse cycle information signal CD<0> is 0 or 1. The half cycle information signals FH<0:8> and the number of delay cells processing the signals, set when the first coarse cycle information signal CD<0> is 0, are shown in Table 1.

TABLE 1

| DTC_H unit | CD<0> = 0(even) | | | | | | | | |
|---|---|---|---|---|---|---|---|---|---|
| FD<0:8>(T) | 0 | 1 | 2 | 3 | 4 | 5 | 6 | 7 | 8 |
| Number of delay cells | 0 | 2 | 4 | 6 | 8 | 10 | 12 | 14 | 16 |
| FH<0:8>(T/2) | 0 | | 1 | | 2 | | 3 | | 4 |
| Number of delay cells | 1 | | 3 | | 5 | | 7 | | 9 |

The half cycle information signals FH<0:8> and the number of delay cells processing the signals, set when the first coarse cycle information signal CD<0> is 1, are shown in Table 2.

TABLE 2

| DTC_H unit | CD<0> = 1(odd) | | | | | | | | |
|---|---|---|---|---|---|---|---|---|---|
| FD<0:8>(T) | 0 | 1 | 2 | 3 | 4 | 5 | 6 | 7 | 8 |
| Number of delay cells | 0 | 2 | 4 | 6 | 8 | 10 | 12 | 14 | 16 |
| FH<0:8>(T/2) | 4 | | 5 | | 6 | | 7 | | 8 |
| Number of delay cells | 9 | | 11 | | 13 | | 15 | | 17 |

The number of delay cells processing the signals is set to 26 based on the value of the first coarse cycle information signal CD<00>, 1, and the value of the fifth fine cycle information signal FD<4>, 1, in connection with the operation of the TDC unit 210 of FIGS. 3 and 4. Accordingly, when CD<0>=1, the seventh half cycle information signal FH<6> is set to a logic high and the number of delay cells processing the signal is set to 13. Here, 13 delay cells cause a delay time delayH (shown in FIG. 6) from the beginning of the operation of the oscillator 510 to the first output of the oscillator 510. Accordingly, the seventh half cycle information signal FH<6> is generated as a logic high signal.

Figure 6:
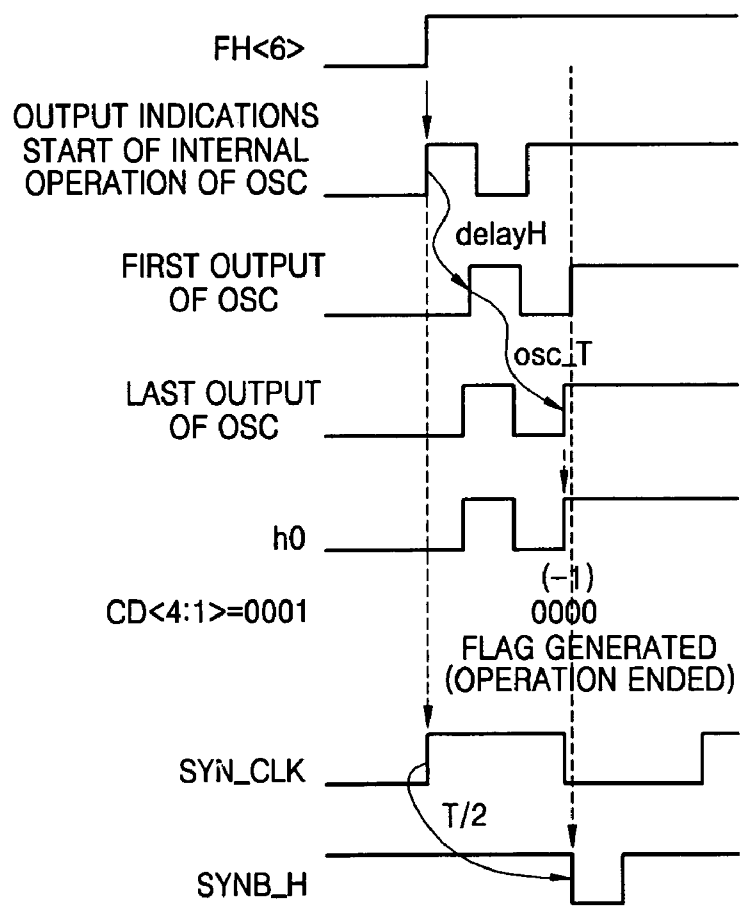
FIG. 6 is a timing diagram for explaining the operation of the DTC_H unit of FIG. 5.

The operation of the DTC_H unit 220 is shown in FIG. 6. Referring to FIG. 6, the oscillator 510 begins to operate in response to the seventh half cycle information signal FH<6> at a logic high and after the thirteenth delay cell processes the seventh half cycle information signal FH<6>, that is, after the delay time delayH has elapsed, the output of the first unit delay cell of the oscillator 510 is output from the oscillator 510. After one cycle OSC_T of the oscillator 510, the output of the last unit delay cell of the oscillator 510 is output from the oscillator 510. Though the second turn signal h0 generates two pulses, the first pulse is ignored because the second pulse indicates that the signals input to the oscillator 510 have passed through the unit delay cells of the oscillator 510 once after the lapse of the delay time delayH.

The counter 520 decreases the second through fifth coarse cycle information signals CD<4:1> one by one after receiving the second pulse of the second turn signal h0. Because the second through fifth coarse cycle information signals CD<4:1> are represented as 0001 (referring to FIG. 4), the counter 520 subtracts 1 from 0001 to generate the half clock signal SYNB_H when the second through fifth coarse cycle information signals CD<4:1> become 0. The half clock signal SYNB_H is generated, for example, as a low pulse synchronized with a falling edge, and is delayed by T/2 from the internal clock signal SYN_CLK.

Here, T is the period of the input clock signal RCLK and corresponds to the value obtained by adding the delay time of 8 delay cells to 3*OSC_T, that is, the delay time of 62 delay cells. Accordingly, when T is written as 2*OSC_T plus the delay time of (18+8) delay cells, T/2 equals 1*OSC_T plus the delay time of 13 delay cells, that is, the delay time of 31 delay cells. This is in conformity with the operation of the DTC_H unit 220.

Figure 7:
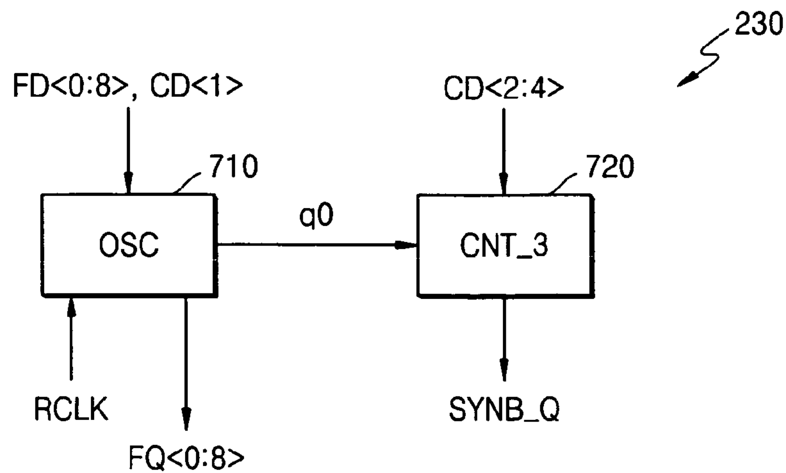
FIG. 7 illustrates a DTC_Q unit of FIG. 2.

The DTC_Q unit 230 of FIG. 2 is shown in detail in FIG. 7. Referring to FIG. 7, the DTC_Q unit 230 receives the second through fifth coarse cycle information signals CD<1:4>, the half cycle information signals FH<0:8> and the input clock signal RCLK to generate a quad clock signal SYNB_Q delayed by T/4 from the input clock signal RCLK. In addition, the DTC_Q unit 230 generates quad cycle information signals FQ<0:8>.

The DTC_Q unit 230 includes an oscillator 710 that receives the second coarse cycle information signal CD<1>, the half cycle information signals FH<0:8> and the input clock signal RCLK to generate the quad cycle information signals FQ<0:8>, and a counter 720 that generates the quad clock signal SYNB_Q in response to a third turn signal q0, and the third, fourth and fifth coarse cycle information signals CD<2:4>. The third turn signal q0 indicates that the signals input to the oscillator 710 have passed through unit delay cells of the oscillator 710 once.

The oscillator 710 comprises nine unit delay cells that are connected in serial. Each of the unit delay cells includes two delay cells and thus the oscillator 710 includes 18 delay cells. The output of the last unit delay cell is input to the first unit delay cell. The oscillator 710 generates the third turn signal q0 in response to the output of the last unit delay cell. The DTC_Q unit 230 generates the quad cycle information signals FQ<0:8> according to whether the value of the second coarse cycle information signal CD<1> is 0 or 1. The quad cycle information signals FQ<0:8> and the number of delay cells processing the signals, set when the second coarse cycle information signal CD<1> is 0, are shown in Table 3.

TABLE 3

| DTC_Q unit | CD<1> = 0(even) | | | | | | | | |
|---|---|---|---|---|---|---|---|---|---|
| FH<0:8>(T) | 0 | 1 | 2 | 3 | 4 | 5 | 6 | 7 | 8 |
| Number of delay cells | 0 | 2 | 4 | 6 | 8 | 10 | 12 | 14 | 16 |
| FQ<0:8>(T/2) | 0 | | 1 | | 2 | | 3 | | 4 |
| Number of delay cells | 1 | | 3 | | 5 | | 7 | | 9 |

The quad cycle information signals FQ<0:8> and the number of delay cells processing the signal, set when the second coarse cycle information signal CD<1> is 1, are shown in Table 4.

TABLE 4

| DTC_Q unit | CD<1> = 1(odd) | | | | | | | | |
|---|---|---|---|---|---|---|---|---|---|
| FH<0:8>(T) | 0 | 1 | 2 | 3 | 4 | 5 | 6 | 7 | 8 |
| Number of delay cells | 0 | 2 | 4 | 6 | 8 | 10 | 12 | 14 | 16 |
| FQ<0:8>(T/2) | 4 | | 5 | | 6 | | 7 | | 8 |
| Number of delay cells | 9 | | 11 | | 13 | | 15 | | 17 |

The number of delay cells processing the signals in the oscillator 710 is set to 15 based on the value of the second coarse cycle information signal CD<1>, 1, and the value of the eighth half cycle information signal FH<7>, 1, in connection with the operations of the TDC unit 210 and DTC_H unit 220 shown in FIGS. 3, 4, 5 and 6. In other words, the number of the delay cells of the oscillator 710 is half the number of delay cells of the oscillator 510, that is, 18+13=31, approximately 30, which is set based on the value of the first coarse cycle information signal CD<0>, 1, and the value of the seventh half cycle information signal FH<6>, 1, in the DTC_H unit 220. Accordingly, the eighth quad cycle information signal FQ<7> is set to a logic high level and the number of delay cells of the oscillator 710 is set to 15 according to Table 4.

Figure 8:
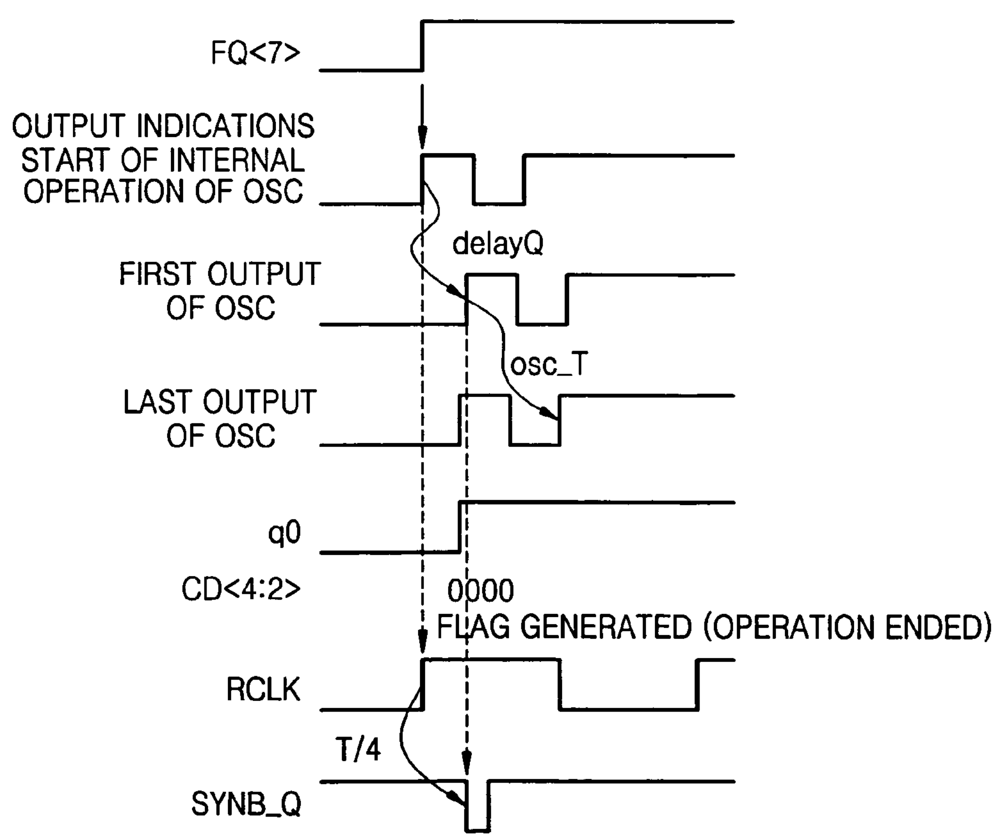
FIG. 8 is a timing diagram for explaining the operation of the DTC_Q unit of FIG. 7.

As shown in FIG. 8, 15 delay cells have a delay time delayQ from when the oscillator 710 begins to operate until the first output of the oscillator 710. Accordingly, the eighth quad cycle information signal FQ<7> is generated as a logic high level signal.

The operation of the DTC_Q unit 230 is illustrated in FIG. 8. Referring to FIG. 8, the operation of the oscillator 710 starts when the eighth quad cycle information signal FQ<7> is at a logic high and after the fifteenth delay cell processes the eighth quad cycle information signal FQ<7>, that is, after the delay time delayQ has elapsed, the output of the first unit delay cell of the oscillator 710 is output from the oscillator 710. After one cycle OSC_T of the oscillator 710, the output of the last unit delay cell of the oscillator 710 is output by the oscillator 710. The third turn signal q0 is generated by the counter 720, which receives the value of the third, fourth and fifth coarse cycle information signals CD<2:4>, 000, in response to the output of the first unit delay cell of the oscillator 710. The quad clock signal SYNB_Q is generated in response to the third turn signal q0. The quad clock signal SYNB_Q is generated, for example, as a low pulse synchronized with a falling edge and delayed by T/4 from the input clock signal RCLK.

Here, T equals the delay time of 62 delay cells, T/2 equals the delay time of 31 delay cells, and T/4 equals the delay time of 15 delay cells. This is in conformity with the operation of the DTC_Q unit 230.

Figure 9:
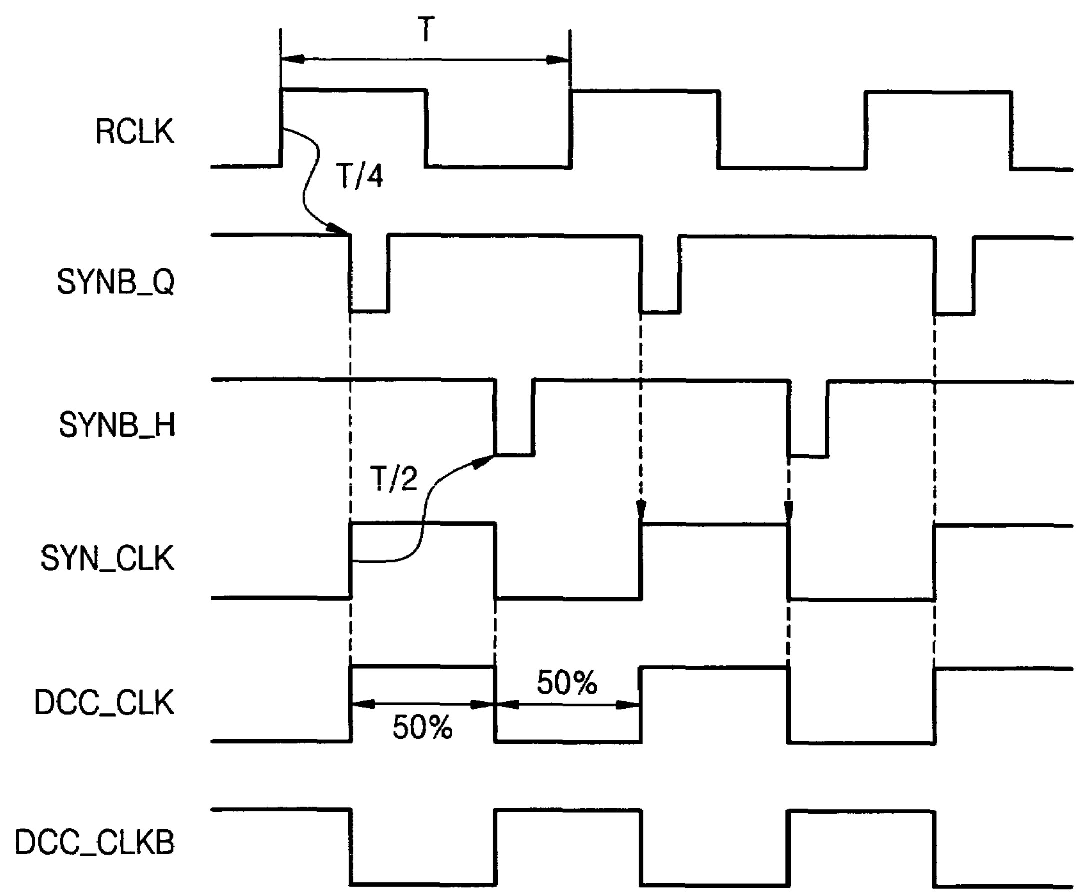
FIG. 9 is a timing diagram for explaining the operation of the DLL of FIG. 2.

Referring back to FIG. 2 and to FIG. 9, the clock recovery unit 240 generates the internal clock signal SYN_CLK in response to the half cycle information signal SYNB_H output from the DTC_H unit 220 and the quad cycle information signal SYNB_Q output from the DTC_Q unit 230. A rising edge of the internal clock signal SYN_CLK is synchronized with a falling edge of the quad cycle information signal SYNB_Q and a falling edge of the internal clock signal SYN_CLK is synchronized with a falling edge of the half cycle information signal SYNB_H. That is, the internal clock signal SYN_CLK is generated as a logic high level signal delayed by T/4 from the input clock signal RCLK and generated as a logic low level signal delayed by T/2 from the logic high level signal.

The internal clock signal SYN_CLK is generated as output signals DLL_CLK and DLL_CLKB of the DLL, which each have a duty cycle of 50%. The complementary DLL output signal DLL_CLKB is an inversion of the DLL output signal DLL_CLK. Thus, the DLL according to exemplary embodiments of the present invention generates the output clock signals DLL_CLK and DLL_CLKB delayed by T/4 from the input clock signal RCLK. Although the present invention has been shown to generate the output clock signals DLL_CLK and DLL_CLKB delayed by T/4 from the input clock signal RCLK, it is to be understood by those of ordinary skill in the art that the delay time is not limited to T/4.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A delay locked loop (DLL) comprising:

a time-to-digital converter for receiving an input clock signal and converting a period (T) of the input clock signal into a digital signal to generate coarse cycle information signals and fine cycle information signals;

a first cycle delay unit for generating a first cycle clock signal delayed by T/2 from an internal clock signal and half cycle information signals in response to the coarse cycle information signals and fine cycle information signals;

a second cycle delay unit for generating a second cycle clock signal delayed by T/4 from the input clock signal in response to the coarse cycle information signals and half cycle information signals; and a clock recovery unit for generating the internal clock signal and output clock signals in response to the first and second cycle clock signals.

2. The DLL as claimed in claim 1, wherein the time-to-digital converter comprises:

an oscillator for receiving one cycle of the input clock signal to generate the fine cycle information signals; and a counter for counting pulses output from the oscillator to generate the coarse cycle information signals.

3. The DLL as claimed in claim 2, wherein the oscillator comprises:

a plurality of delay cells connected in serial, wherein the input clock signal is input to a first delay cell, and an output of the last delay cell is input to the counter and the first delay cell.

4. The DLL as claimed in claim 1, wherein the first cycle delay unit comprises:

an oscillator for receiving the coarse cycle information signals, the fine cycle information signals and the internal clock signal to generate the half cycle information signals; and a counter for generating the first cycle clock signal in response to the output of the oscillator and the coarse cycle information signals.

5. The DLL as claimed in claim 4, wherein the oscillator comprises:

a plurality of delay cells connected in serial, wherein the internal clock signal is input to a first delay cell, an output of a last delay cell is input to the counter and the first delay cell, and the half cycle information signals and the number of the plurality of delay cells processing the signals are set based on the a value of the least significant bit of the coarse cycle information signals.

6. The DLL as claimed in claim 5, wherein the oscillator begins to operate after the delay time of the plurality of delay cells has elapsed.

7. The DLL as claimed in claim 1, wherein the second cycle delay unit comprises:

an oscillator for receiving the coarse cycle information signals, the half cycle information signals and the input clock signal to generate quad cycle information signals; and a counter for generating the second cycle clock signal in response to an output of the oscillator and the quad cycle information signals.

8. The DLL as claimed in claim 7, wherein the oscillator comprises:

a plurality of delay cells connected in serial, wherein the input clock signal is input to a first delay cell, an output of a last delay cell is input to the counter and the first delay cell, and the quad cycle information signals and the number of the plurality of delay cells processing the signals are set based on a value of the least significant bit-1 of the coarse cycle information signals.

9. The DLL as claimed in claim 8, wherein the oscillator begins to operate after the delay time of the plurality of delay cells has elapsed.

10. The DLL as claimed in claim 1, wherein the output clock signals generated by the clock recovery unit are delayed by T/4 from the input clock signal and have a duty cycle of 50%.

11. A delay locked loop (DLL) comprising:

a time-to-digital converter for receiving an input clock signal and converting a period (T) of the input clock signal into a digital value to generate coarse cycle information signals and fine cycle information signals;

a first cycle delay unit for receiving the coarse cycle information signals, the fine cycle information signals and an internal clock signal, to generate a first clock signal delayed by a first delay time from the internal clock signal and a first cycle information signal;

a second cycle delay unit for receiving the coarse cycle information signals, the first cycle information signal and the input clock signal, to generate a second clock signal delayed by a second delay time from the input clock signal; and a clock recovery unit for receiving the first and second clock signals to generate output clock signals that are delayed by the first delay time from the internal clock signal and the input clock signal and have a duration corresponding to the second delay time.

12. The DLL as claimed in claim 11, wherein the time-to-digital converter comprises:

an oscillator comprising a plurality of delay cells for receiving one cycle of the input clock signal to generate the fine cycle information signals, which are output from the plurality of delay cells, and a first turn signal; and a counter for counting pulses of the first turn signal to generate the coarse cycle information signals.

13. The DLL as claimed in claim 11, wherein the first cycle delay unit comprises:

an oscillator comprising a plurality of delay cells for receiving the internal clock signal and generating half cycle information signals and a second turn signal in response to the coarse cycle information signals and the fine cycle information signals; and a counter for generating the first cycle clock signal in response to the second turn signal and the coarse cycle information signals.

14. The DLL as claimed in claim 13, wherein the oscillator sets the half cycle information signals and the number of the plurality of delay cells processing the signals based on the a value of the least significant bit of the coarse cycle information signals.

15. The DLL as claimed in claim 11, wherein the second cycle delay unit comprises:

an oscillator comprising a plurality of delay cells for receiving the input clock signal and generating quad cycle information signals and a third turn signal in response to the coarse cycle information signals and the half cycle information signals; and a counter for generating the second cycle clock signal in response to the third turn signal and the quad cycle information signals.

16. The DLL as claimed in claim 15, wherein the oscillator sets the quad cycle information signals and the number of the plurality of delay cells processing the signals based on the a value of the least significant bit-1 of the coarse cycle information signals.

17. The DLL as claimed in claim 11, wherein the first delay time is T/2 and the second delay time is T/4.

18. A clock synchronizing method comprising:

receiving an input clock signal and converting a period (T) of the input clock signal into a digital signal to generate coarse cycle information signals and fine cycle information signals;

generating a first cycle clock signal delayed by a first delay time from an internal clock signal and half cycle information signals in response to the coarse cycle information signals and the fine cycle information signals;

generating a second cycle clock signal delayed by a second delay time from the input clock signal in response to the coarse cycle information signals and the fine cycle information signals;

generating the internal clock signal delayed by the first delay time from the input clock signal in response to the first and second cycle clock signals; and generating output clock signals delayed by the second delay time from the input clock signal the output clock signals having a duration corresponding to the second cycle time in response to the first and second cycle clock signals.

19. The clock synchronizing method as claimed in claim 18, wherein the first delay time is T/2 and the second delay time is T/4.

20. The clock synchronizing method as claimed in claim 18, wherein the step of receiving an input clock signal and converting a period (T) of the input clock signal to generate coarse cycle information signals and fine cycle information signals comprises:

receiving one cycle of the input clock signal via an oscillator comprising a plurality of delay cells and generating the fine cycle information signals and a first turn signal as outputs of the plurality of delay cells; and generating the coarse cycle information signals with a counter for counting pulses of the first turn signal.

21. The clock synchronizing method as claimed in claim 18, wherein the step of generating a first cycle clock signal delayed by a first delay time from an internal clock signal and a half cycle information signal in response to the coarse cycle information signals and the fine cycle information signals comprises:

receiving the internal clock signal via an oscillator comprising a plurality of delay cells, generating the half cycle information signals as outputs of the plurality of delay cells, and generating a second turn signal in response to the coarse cycle information signals and the fine cycle information signals; and generating the first cycle clock signal in response to the coarse cycle information signals with a counter for counting pulses of the second turn signal.

22. The clock synchronizing method as claimed in claim 21, wherein the oscillator sets the half cycle information signals and the number of the plurality of delay cells processing the signals based on a value of the least significant bit of the coarse cycle information signals.

23. The clock synchronizing method as claimed in claim 18, wherein the step of generating a second cycle clock signal delayed by a second delay time from the input clock signal in response to the coarse cycle information signals and the fine cycle information signals comprises:

receiving the input clock signal via an oscillator including a plurality of delay cells and generating quad cycle information signals and a third turn signal in response to the coarse cycle information signals and the half cycle information signals; and generating the second cycle clock signal in response to the quad cycle information signals with a counter for counting the third turn signal.

24. The clock synchronizing method as claimed in claim 23, wherein the oscillator sets the quad cycle information signals and the number of the plurality of delay cells processing the signals based on a value of the least significant bit-1 of the coarse cycle information signals.

* * * * *